US012610750B2

(12) United States Patent
Xie et al.

(10) Patent No.: US 12,610,750 B2
(45) Date of Patent: Apr. 21, 2026

(54) BRIDGE CELL PHASE CHANGE MEMORY

(71) Applicant: International Business Machines Corporation, Armonk, NY (US)

(72) Inventors: Ruilong Xie, Niskayuna, NY (US); Carl Radens, LaGrangeville, NY (US); Juntao Li, Cohoes, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 947 days.

(21) Appl. No.: 17/552,498

(22) Filed: Dec. 16, 2021

(65) Prior Publication Data

US 2023/0200266 A1      Jun. 22, 2023

(51) Int. Cl.
H10N 70/20          (2023.01)
H10N 70/00          (2023.01)

(52) U.S. Cl.
CPC ......... H10N 70/231 (2023.02); H10N 70/021 (2023.02); H10N 70/063 (2023.02); H10N 70/823 (2023.02); *H10N 70/8828* (2023.02)

(58) Field of Classification Search
CPC .. H10N 70/231; H10N 70/823; H10N 70/064; H10N 70/821
See application file for complete search history.

(56) References Cited

U.S. PATENT DOCUMENTS 7,884,342 B2      2/2011  Lung
8,792,265 B2      7/2014  In 'T Zandt 9,087,985 B2      7/2015   Chen
10,454,025 B1 *  10/2019  Cheng ................... H10N 70/043
11,205,682 B2 *  12/2021  Wu ....................... H10N 70/231
12,185,646 B2 *  12/2024  Li ......................... H10N 70/826
2008/0019257 A1   1/2008  Philipp
2009/0179184 A1   7/2009  Liu
2010/0238720 A1   9/2010  Tio Castro (Continued)

FOREIGN PATENT DOCUMENTS

TW          200529377          9/2005
TW          200908294 A        2/2009

OTHER PUBLICATIONS

Bureau of Intellectual Property, Ministry of Economic Affairs, TW, Counterpart Taiwan Application 11220798510, Search Report. Aug. 17, 2023. Pages: 7 (in Chinese, categories of references shown in English on p. 5).

(Continued)

*Primary Examiner* — Mounir S Amer
(74) *Attorney, Agent, or Firm* — Seed Intellectual Property Law Group LLP

(57)          ABSTRACT

A phase change bridge memory cell includes: a first inter-level dielectric layer; a first electrode and a second electrode disposed in the first interlevel dielectric layer and separated by a portion of the first interlevel dielectric layer; an interlevel dielectric pillar on the portion of the first interlevel dielectric layer; a first phase change material on the inter-level dielectric pillar; and a second phase change material including two areas on opposite sides of the interlevel dielectric pillar and electrically connected by the first phase change material, wherein the second phase change material is connected to the first electrode and the second electrode.

12 Claims, 16 Drawing Sheets

(56)                    References Cited

U.S. PATENT DOCUMENTS

| | | | |
|---|---|---|---|
| 2013/0001505 A1* | 1/2013 | Delhougne ......... | H10N 70/063 |
| | | | 257/E45.001 |
| 2020/0219933 A1* | 7/2020 | Cheng ................ | H10N 70/841 |

OTHER PUBLICATIONS

Rosner, Yvonne, European Patent Office, Counterpart PCT Application PCT/EP2022/082256,International Search Report and the Written Opinion. Feb. 27, 2023. pp. 14.

* cited by examiner

700

706

705

702

701

1200

1210

1209

1208

1207

1206

1205

1204

1203

1202

1201

1102

1103

1104

1101

BRIDGE CELL PHASE CHANGE MEMORY

BACKGROUND

The present disclosure relates generally to a phase change memory (PCM), and more particularly to a phase change bridge device with improved control over a phase change.

Phase change memory has emerged as a viable option for machine learning. For example, phase change memory can be used to stored weights of a neural network for artificial intelligence (AI) applications. A bridge cell is type of phase change memory including a thin layer of a phase change memory material bridging two electrodes.

Typically, in programming a phase change memory operation, electrical pulses are applied through a chalcogenide material to generate local joule heating, where a phase-change material near an electrode contact region can be changed to either crystalline or amorphous state. The phase-change material is typically selected from the group of chalcogenide glasses, such as GeSbTe (germanium-antimony-tellurium or GST).

During phase change operations, e.g., SET and RESET operations, the crystallization and amorphization of the phase change material occurs randomly within the bridge between two large electrodes, resulting variations in memory device performance.

BRIEF SUMMARY

According to embodiments of the present invention, a phase change bridge memory cell includes: a first interlevel dielectric layer; a first electrode and a second electrode disposed in the first interlevel dielectric layer and separated by a portion of the first interlevel dielectric layer; an interlevel dielectric pillar on the portion of the first interlevel dielectric layer; a first phase change material on the interlevel dielectric pillar; and a second phase change material including two areas on opposite sides of the interlevel dielectric pillar and electrically connected by the first phase change material, wherein the second phase change material is connected to the first electrode and the second electrode.

According to at least one embodiment, the interlevel dielectric pillar includes: a plurality of first interlevel dielectric material layers; and a plurality of second interlevel dielectric material layers interleaved with the first interlevel dielectric material layers, wherein a first width of the plurality of first interlevel dielectric material layers is less than a second width of the plurality of second interlevel dielectric material layers, and wherein the second phase change material has a sloped sidewall opposite a sidewall of the interlevel dielectric pillar that defines a plurality of neck portions in the second phase change material, where a thickness of the second phase change material on sidewalls of the interlevel dielectric pillar is greater at the first electrode and the second electrode than at the first phase change material.

According to some embodiments, a phase change bridge memory cell includes: a substrate; a first phase change material on the substrate; a second phase change material including two areas electrically connected by the first phase change material; a pillar on the portion on the first phase change material and separating the two areas of the second phase change material; and a first electrode and a second electrode on the two areas of the second phase change material and separated by the pillar.

According to some embodiments, a method of manufacturing a phase change memory device includes: providing a substrate; forming a first electrode and a second electrode;

forming a first phase change material; forming an interlevel dielectric (ILD) pillar; forming a second phase change material and a third phase change material connected by the first phase change material, wherein the second phase change material is connected to the first electrode and the third phase change material is connected to the second electrode; and forming an ILD fill over the phase change memory device.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

- a bi-state phase change bridge device with improved control over a phase change;
- a multiple-state phase change bridge device with improved control over a phase change.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

Figure 1:
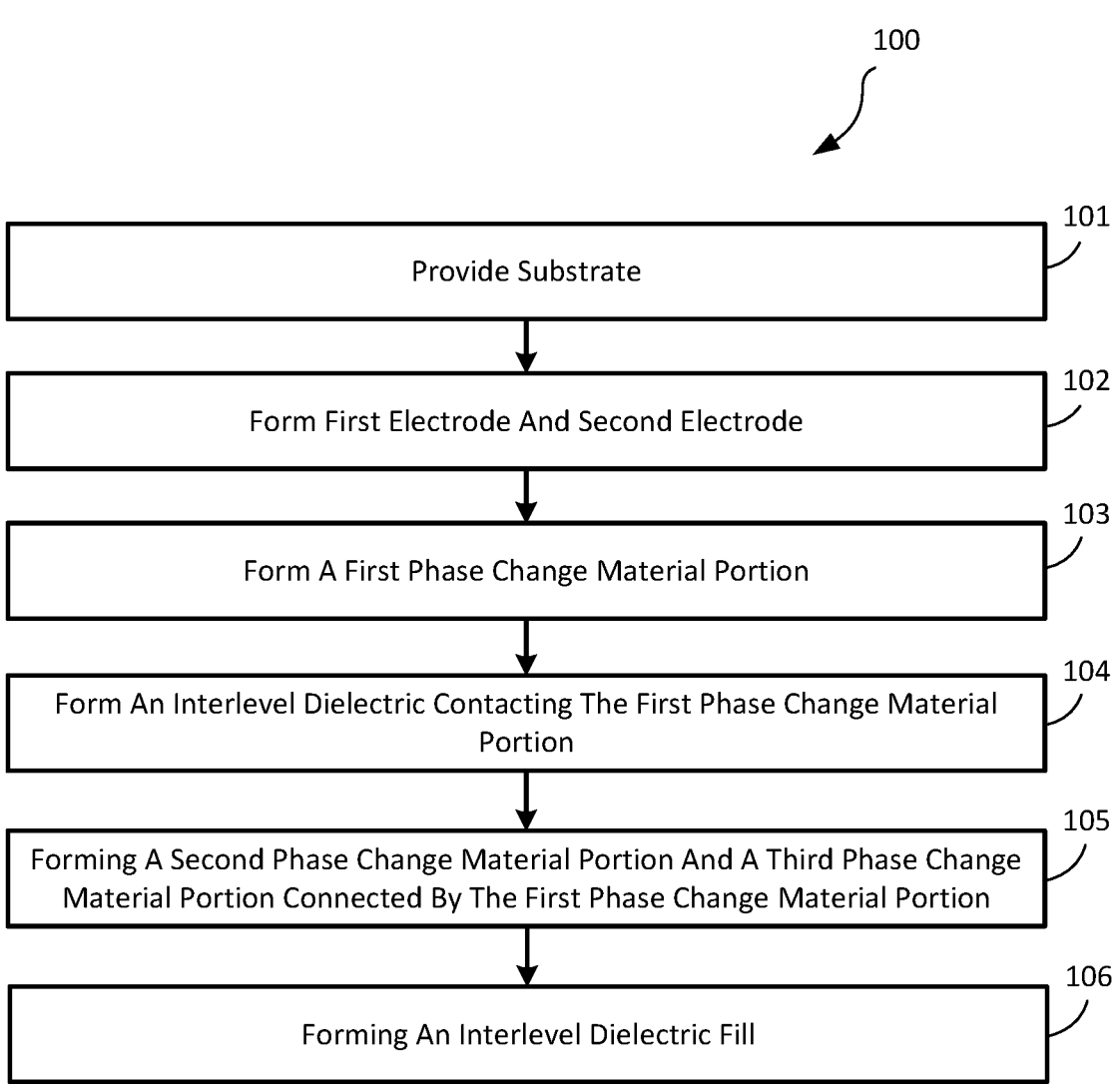
FIG. 1 illustrates methods of forming a phase change memory according to one or more embodiments of the present invention.

According to embodiments of the present invention, a "U" shaped two-state phase change bridge memory cell localizes switching within a phase change material bridging two separated phase change material pads connected to respective metal electrodes.

According to embodiments of the present invention, a multiple-state phase change bridge cell includes a horizontal phase change material bridging two separated phase change material segments with sloped sidewalls.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

According to some embodiments, a method 100 of manufacturing a phase change memory device includes providing a substrate at step 101, forming a first electrode and a second electrode at step 102, forming a first phase change material at step 103, forming an interlevel dielectric (ILD) pillar at step 104, forming a second phase change material and a third phase change material connected by the first phase change material at step 105, wherein the second phase change material is connected to the first electrode and the third phase change material is connected to the second electrode, and forming an ILD fill over the phase change memory device at step 106.

It should be understood that the steps of FIG. 1 can be performed in a verity of orders, as will be illustrated in the following description.

According to at least one embodiment, sidewalls of the second phase change material and the third phase change material are parallel, such that they form a "U" shaped two-state vertical phase change bridge memory cell localizing switching within the first phase change material bridging the second phase change material and the third phase change material.

According to one or more embodiments, sidewalls of the second phase change material and the third phase change material are parallel are sloped from a relatively narrow cross-section proximate to the first phase change material to a relatively wide cross-section away from the first phase change material, wherein the first phase change material bridges the second phase change material and the third phase change material. According to some embodiments, forming the ILD pillar at step 104 further includes forming the ILD pillar have a plurality of relatively narrow portions interleaved by a plurality of relatively thick portions, wherein the plurality of relatively thick portions and the slope of the second phase change material and the third phase change material define thickness of a plurality of neck portions in the second phase change material and the third phase change material.

Referring to at least one embodiments, FIG. 2 through FIG. 5 show cross-section views of first bi-state phase change memory at different steps in a manufacturing process according to one or more embodiments of the present invention. According to at least one embodiment, FIG. 6 shows a cross-section view of a first multiple-state phase change memory.

Figure 2:
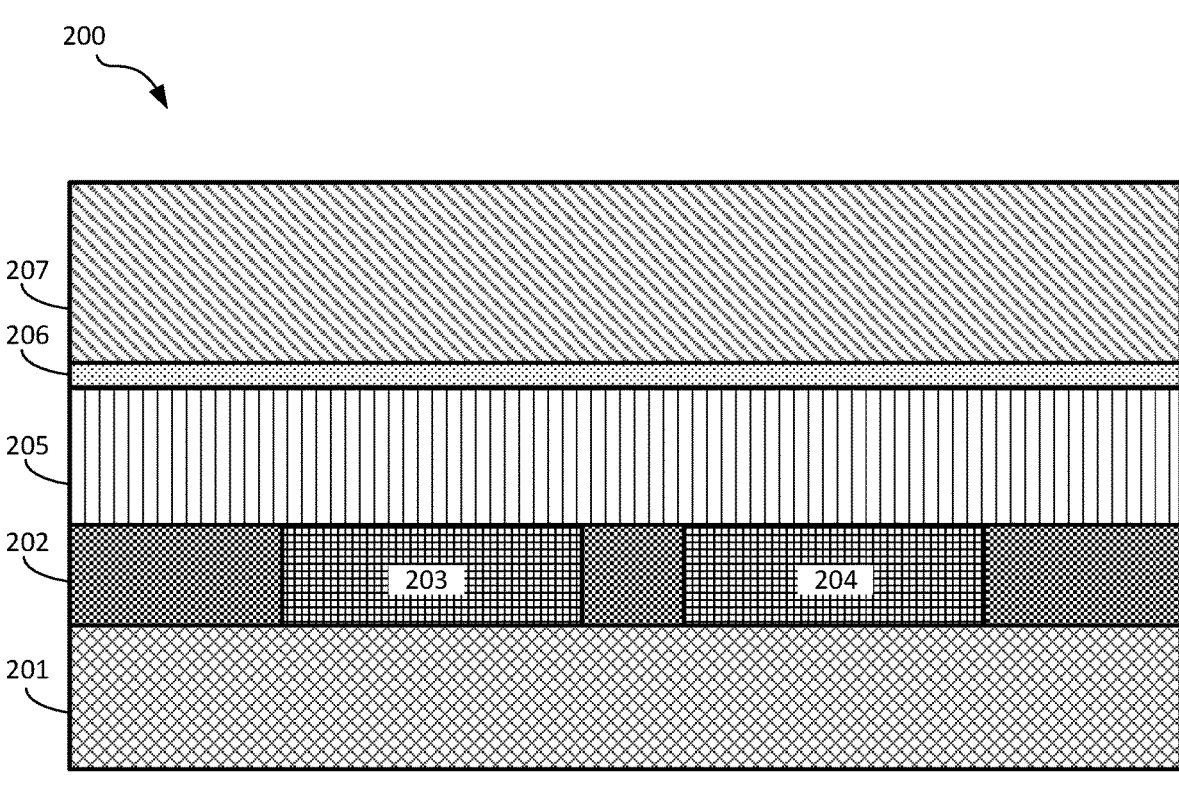
FIGS. 2-5 are cross-section views of first bi-state phase change memory at different steps in a manufacturing process according to one or more embodiments of the present invention.

Referring to FIG. 2, according to some embodiments a first stack 200 is provided including a first substrate 201 (step 101), a first patterned ILD layer 202, and a first electrode 203 and a second electrode 204 (step 102) disposed in the first patterned ILD layer 202. According to at least one embodiment, the first substrate 201 is a device layer, which may include any of a verity of device types, including transistors, capacitors, diodes, etc., with middle of line (MOL) contacts and one or more layers of back end of line (BEOL) interconnects. According to some embodiments, the first stack 200 further comprises a second ILD layer 205, a first phase change material layer 206, and a first hardmask 207. According to some embodiments the first phase change material layer 206 is a thin layer, having a thickness between about 5-35 nanometers (nm).

Figure 3:
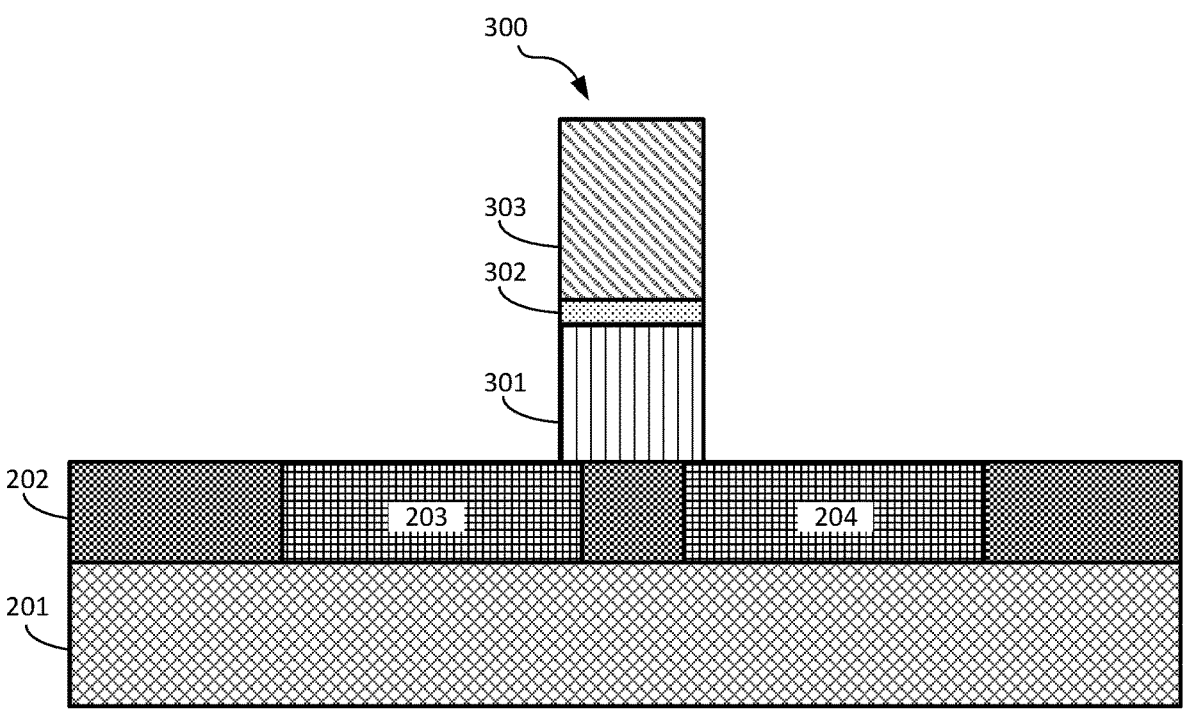

Referring to FIG. 3, according to some embodiments, the stack is patterned (e.g., by conventional lithography and reactive ion etch (RIE)) to form a first pillar 300 comprising a patterned second ILD layer 301 (step 104), a patterned phase change material 302 (step 103), and a patterned hardmask 303. According to some embodiments, the first pillar 300 is formed on a portion of the first patterned ILD layer 202 between the first electrode 203 and the second electrode 204.

Figure 4:
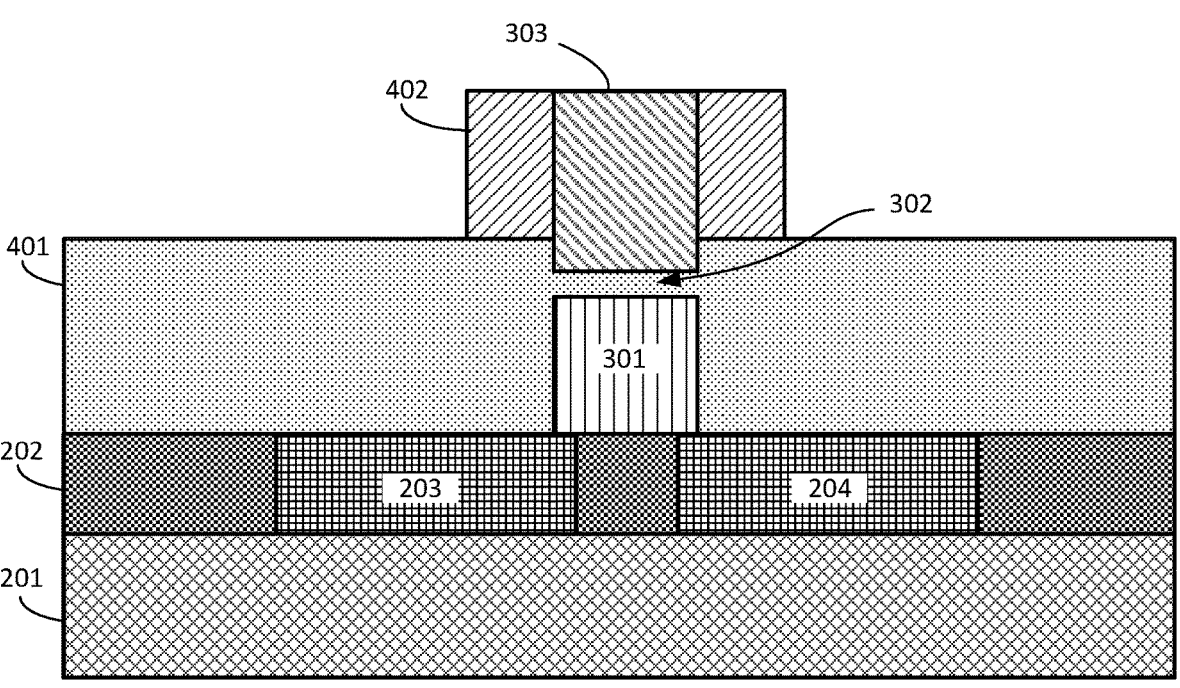

Referring to FIG. 4, according to some embodiments, a second phase change material layer 401, formed by, for example, a phase change material deposition, a chemical mechanical polish (CMP) (e.g., to the top of the patterned hardmask 303), and a recess of the phase change material deposition to form the second phase change material layer 401. According to one or more embodiments, the second phase change material layer 401 has a height sufficient to contact the patterned phase change material 302, and preferably the height that extends above a height of an upper surface of the patterned phase change material 302. According to at least one embodiments, a first spacer 402 is formed around the patterned hardmask 303. According to some embodiments, the first phase change material and the second phase change material may be the same or different phase change materials.

Figure 5:
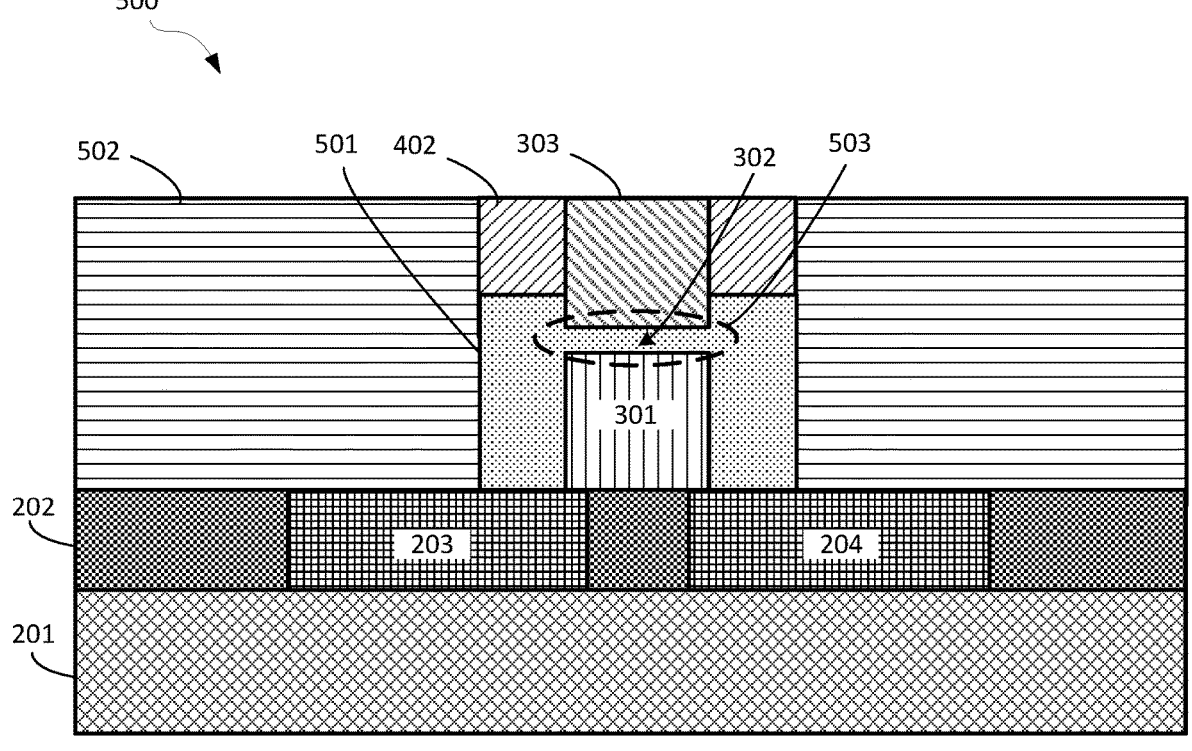
Figure 6:
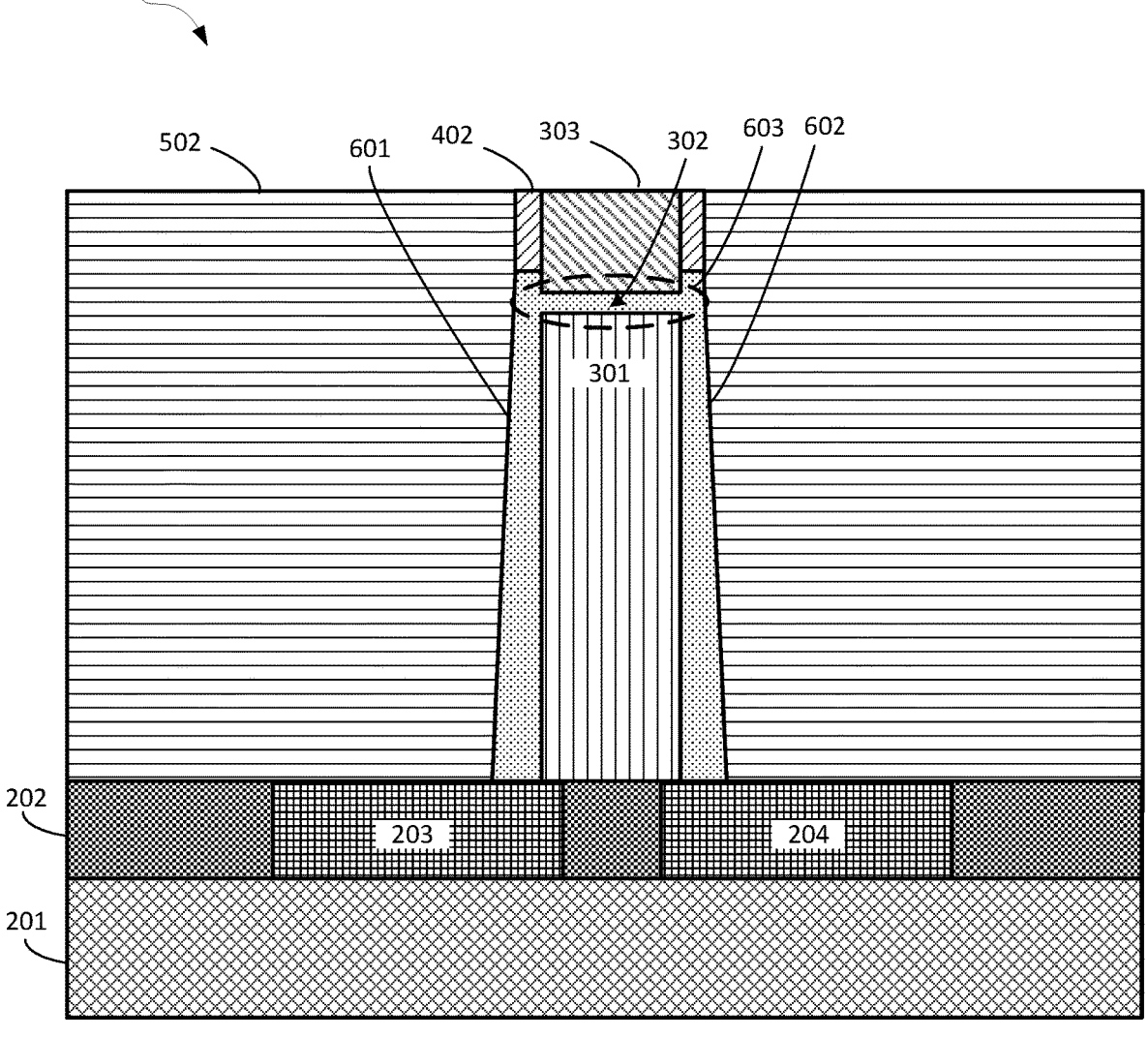
FIG. 6 is a cross-section view of a first multiple-state phase change memory according to one or more embodiments of the present invention.

Referring to FIG. 5, according to some embodiments, to form a first bridge cell 500, the second phase change material layer 401 can be patterned using the first spacer 402 and the patterned hardmask 303 to form a patterned second phase change material 501 (step 105). Further, a third ILD can be deposited and polished (e.g., by CMP) to form a first ILD fill 502 (step 106). According to some embodiments the CMP may remove a top portion of the patterned hardmask 303 and the first spacer 402. As illustrated in FIG. 5, area 503, including the patterned phase change material 302, which is a bridge between two areas of the patterned second phase change material 501, indicates an approximate position of a phase change in the first bridge cell 500. According to some embodiments, the patterned second phase change material 501 directedly contacts the first electrode 203 and the second electrode 204.

Referring to FIG. 6, according to some embodiments, to form a second bridge cell 600, the second phase change material layer 401 can be patterned using the first spacer 402 and the patterned hardmask 303 to form a first sloped phase change material 601 and a second sloped phase change material 602. In some aspects, a slope of a sidewall of the phase change material is between about 2-10 degrees from vertical. According to some embodiments, the second phase change material layer 401 can be patterned by an etch. Further, the third ILD can be deposited and polished (e.g., by CMP) to form the first ILD fill 502. According to some embodiments the CMP may remove a top portion of the patterned hardmask 303 and the first spacer 402. As illustrated in FIG. 6, area 603, including the patterned phase change material 302, which is a bridge between the first sloped phase change material 601 and the second sloped phase change material 602, indicates an approximate position of a phase change in the second bridge cell 600. According to some embodiments, in the second bridge cell 600, the patterned second ILD layer 301 has a greater thickness (height) than that of the first bridge cell 500. According to some embodiments, the first sloped phase change material 601 and the second sloped phase change material 602 directedly contact the first electrode 203 and the second electrode 204, respectively.

According to some aspects, alternate phase change materials can be used. For example, the a phase change memory bridge cell according to some embodiments can include a phase change material such as germanium-antimony-tellurium (GST), gallium-antimony-tellurium (GaST), silver-iridium-antimony-telluride (AIST) material, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. According to example embodiments, the phase change material(s) can be doped (e.g., with one or more of oxygen (O), carbon C, nitrogen (N), silicon (Si), or titanium (Ti)).

FIG. 7 through FIG. 10 show cross-section views of a second bi-state phase change memory at different steps in a manufacturing process according to one or more embodiments of the present invention.

Figure 7:
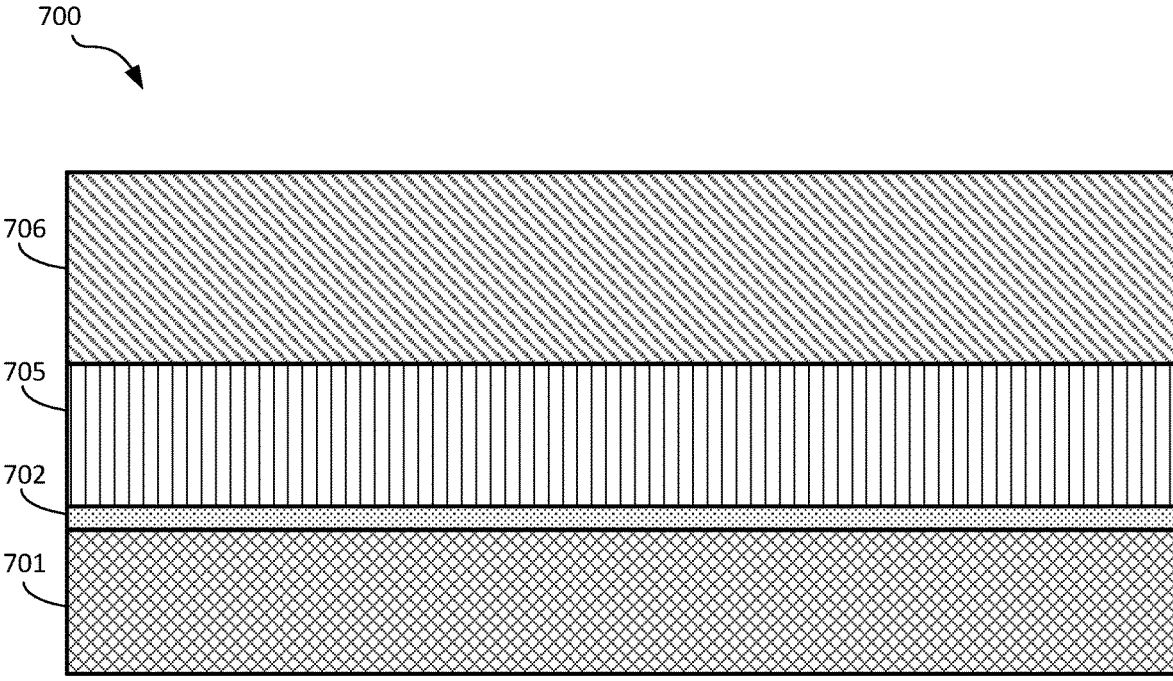
FIGS. 7-10 are cross-section views of a second bi-state phase change memory at different steps in a manufacturing process according to one or more embodiments of the present invention.

Referring to FIG. 7, according to some embodiments, a second stack 700 is provided including a second substrate 701, which may include any of a verity of device types, including transistors, capacitors, diodes, etc., with MOL contacts and one or more layers of BEOL interconnects, a third phase change material layer 702, a fourth ILD layer 705, and a second hardmask 706. According to some embodiments the third phase change material layer 702 is a thin layer, having a thickness between about 5-35 nm.

Figure 8:
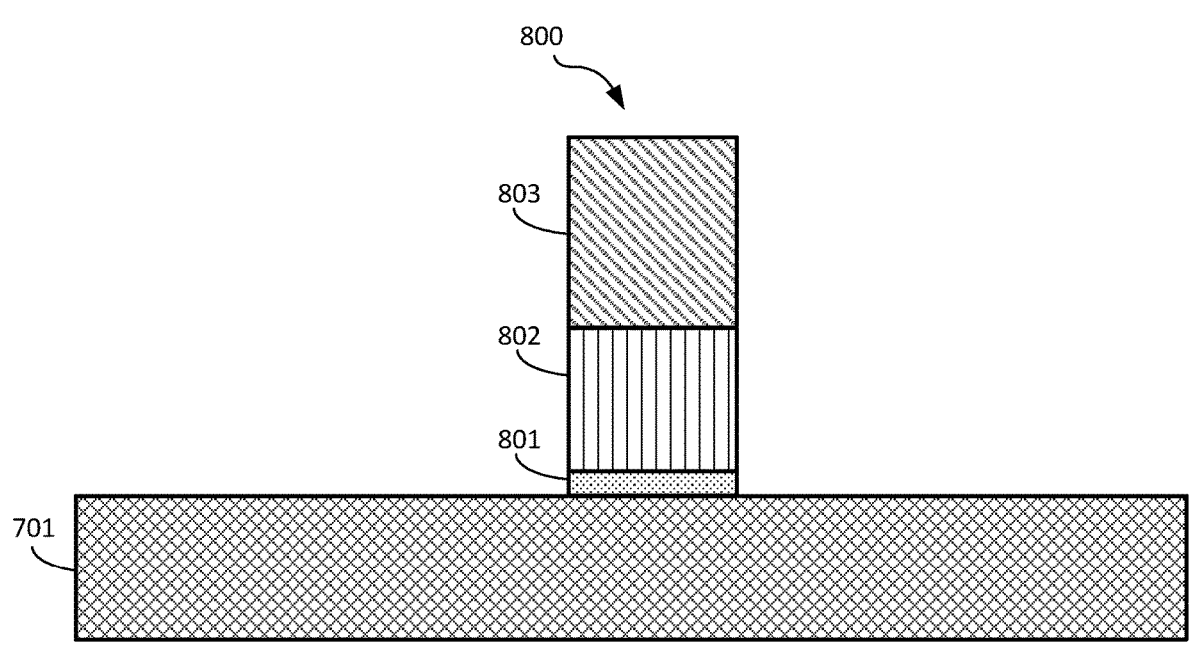

Referring to FIG. 8, according to some embodiments, the stack is patterned (e.g., by conventional lithography and reactive ion etch (RIE)) to form a second pillar 800 comprising a patterned third phase change material 801, a patterned fourth ILD layer 802, and a patterned second hardmask 803.

Figure 9:
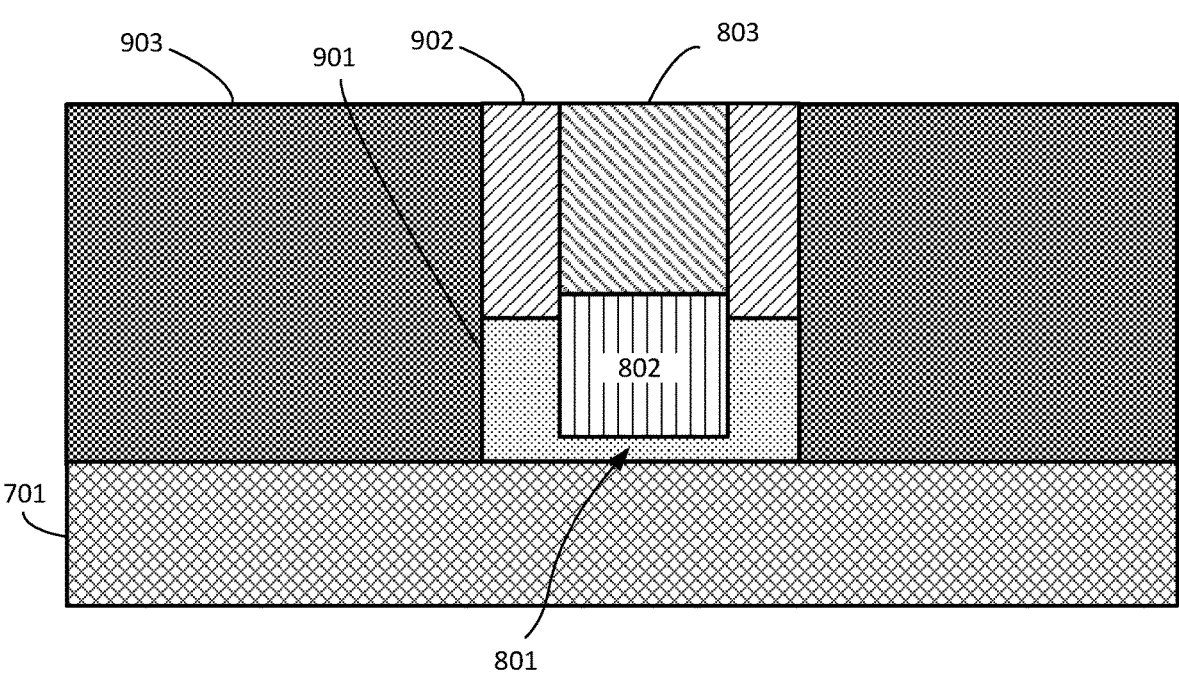

Referring to FIG. 9, according to some embodiments, a second patterned phase change material 901 is formed, e.g., by depositing, polishing, and recessing a GST material, forming a second spacer 902, and patterning the GST material, e.g., by RIE. A second ILD fill 903 is formed by an ILD deposition and a CMP to the patterned second hardmask 803.

According to one or more embodiments, the second patterned phase change material 901 has a height sufficient to fully encapsulate the patterned third phase change material 801. According to some embodiments, the height of the second patterned phase change material 901 is lower than a top most surface of the patterned fourth ILD layer 802.

Figure 10:
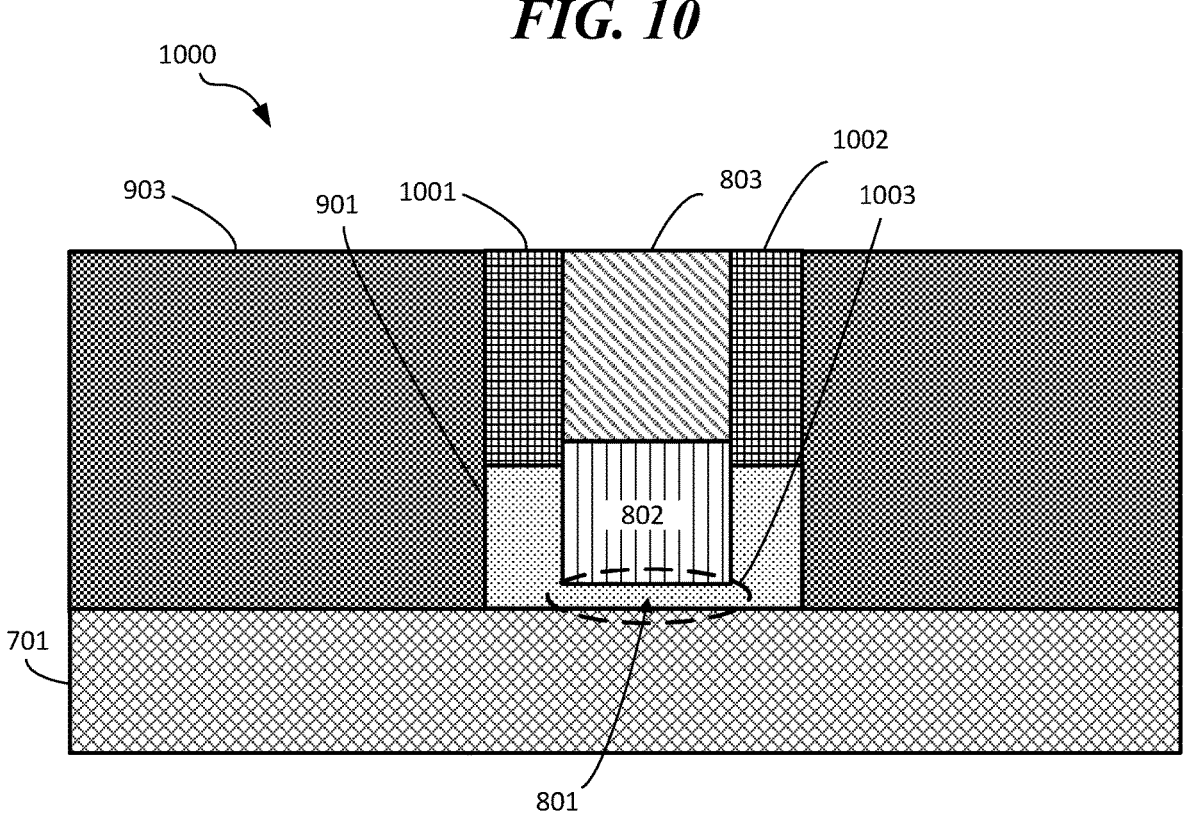

Referring to FIG. 10, according to some embodiments, the second spacer is selectively removed and a metal is deposited forming a third electrode 1001 and a fourth electrode 1002. As illustrated in FIG. 10, area 1003, including the patterned third phase change material 801, which is a bridge between two areas of the second patterned phase change material 901, indicates an approximate position of a phase change in the first bridge cell 1000. According to some embodiments, the patterned third phase change material 801 directedly contacts the third electrode 1001 and the fourth electrode 1002.

Referring to at least one embodiments, FIG. 11 through FIG. 16 shows cross-section views of a second multiple-state phase change memory at different steps in a manufacturing process according to one or more embodiments of the present invention.

Figure 11:
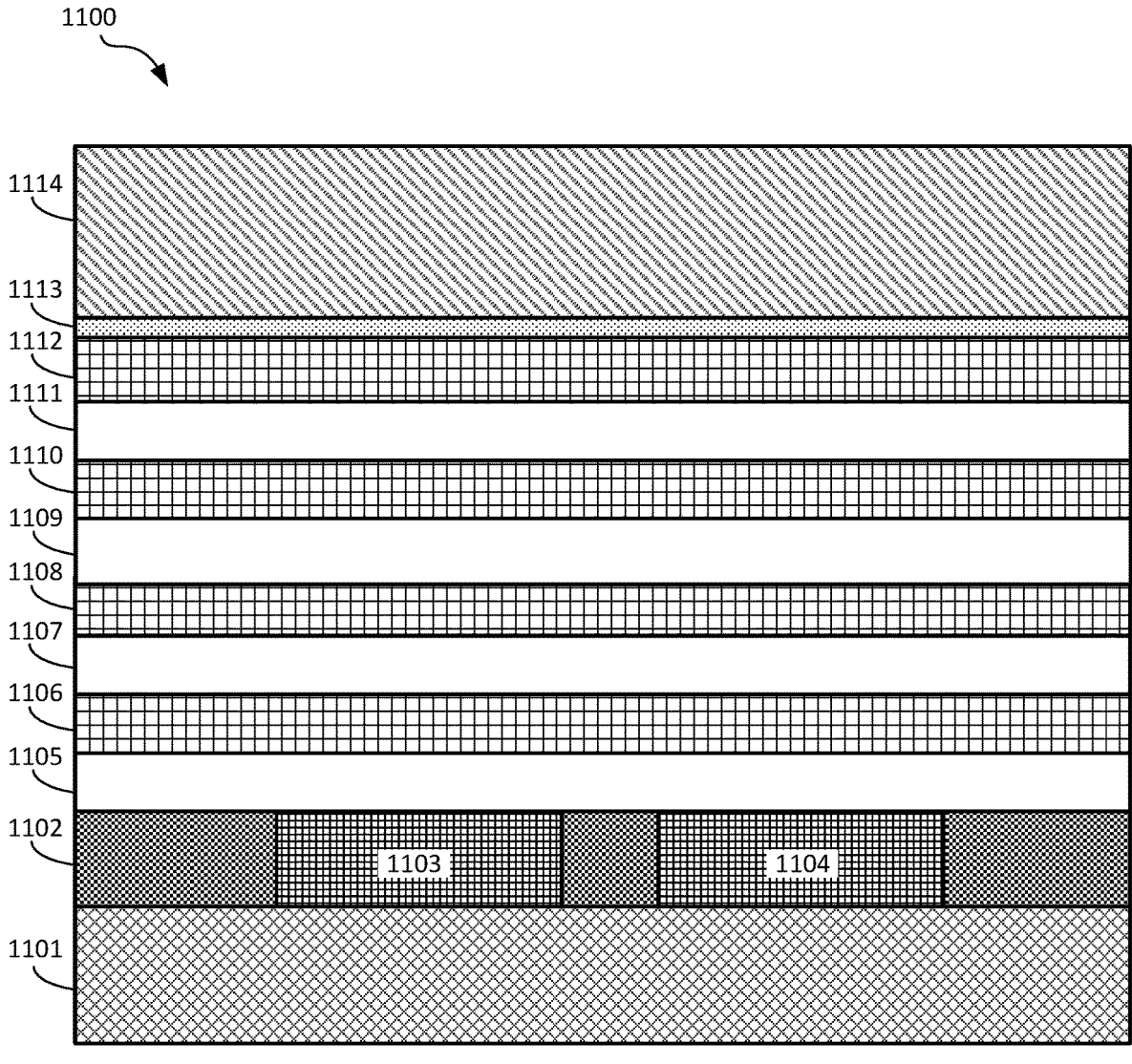
FIGS. 11-16 are cross-section views of a second multiple-state phase change memory at different steps in a manufacturing process according to one or more embodiments of the present invention.

Referring to FIG. 11, according to some embodiments a third stack 1100 is provided including a third substrate 1101, which may include any of a verity of device types, including transistors, capacitors, diodes, etc., with MOL contacts and one or more layers of BEOL interconnects, a second patterned ILD layer 1102, and a fifth electrode 1103 and a sixth electrode 1104 disposed in the second patterned ILD layer 1102. The third stack 1100 further comprises alternating layers of two different dielectric materials. According to some embodiments, the third stack 1100 includes a first dielectric A layer 1105, a second dielectric A layer 1107, a third dielectric A layer 1109, and a fourth dielectric A layer 1111 interleaved with a first dielectric B layer 1106, a second dielectric B layer 1108, a third dielectric B layer 1110, and a fourth dielectric B layer 1112. According to some embodiments, the third stack 1100 further includes a fourth phase change material layer 1113 on a topmost dielectric layer (e.g., the fourth dielectric B layer 1112), and a third hardmask 1114 on the fourth phase change material layer 1113. According to some embodiments the fourth phase change material layer 1113 is a thin layer, having a thickness between about 5-35 nm.

Figure 12:
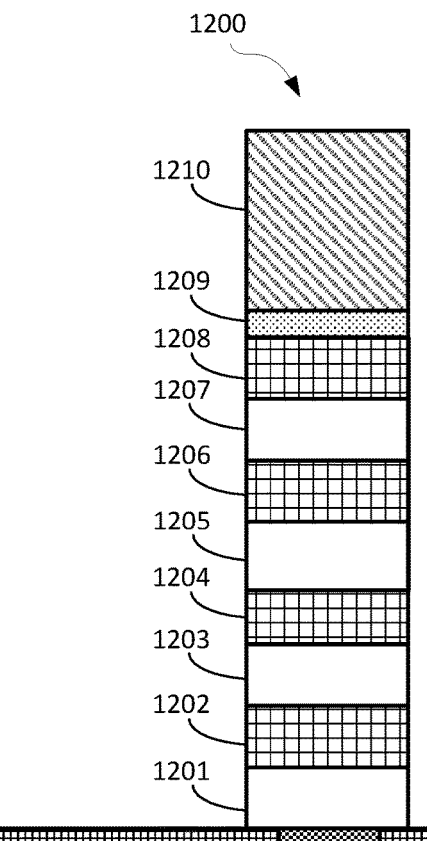
Figure 12:
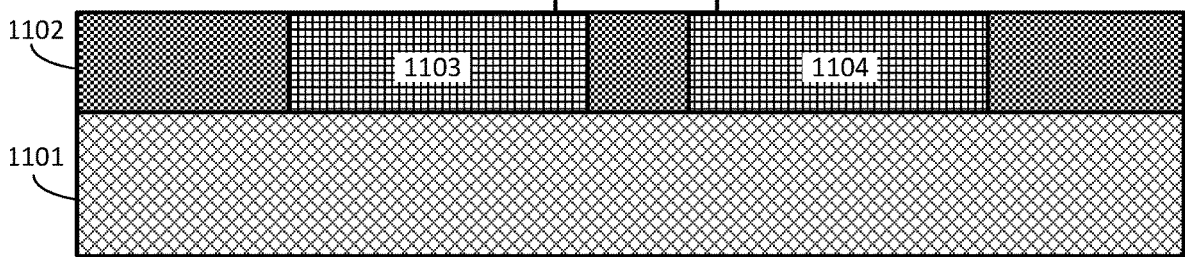

Referring to FIG. 12, according to some embodiments, the third stack is patterned to form a third pillar 1200 on a portion of the second patterned ILD layer 1102 between the fifth electrode 1103 and the sixth electrode 1104. According to at least one embodiments, the third pillar 1200 includes a patterned first dielectric A layer 1201, a patterned second dielectric A layer 1203, a patterned third dielectric A layer 1205, and a patterned fourth dielectric A layer 1207 interleaved with a patterned first dielectric B layer 1202, a patterned second dielectric B layer 1204, a patterned third dielectric B layer 1206, and a patterned fourth dielectric B layer 1208. According to some embodiments, the third pillar 1200 includes a patterned fourth phase change material layer 1209 and a patterned third hardmask 1210. According to some embodiments, the patterned first dielectric A layer 1201 contacts the fifth electrode 1103 and the sixth electrode 1104.

Figure 13:
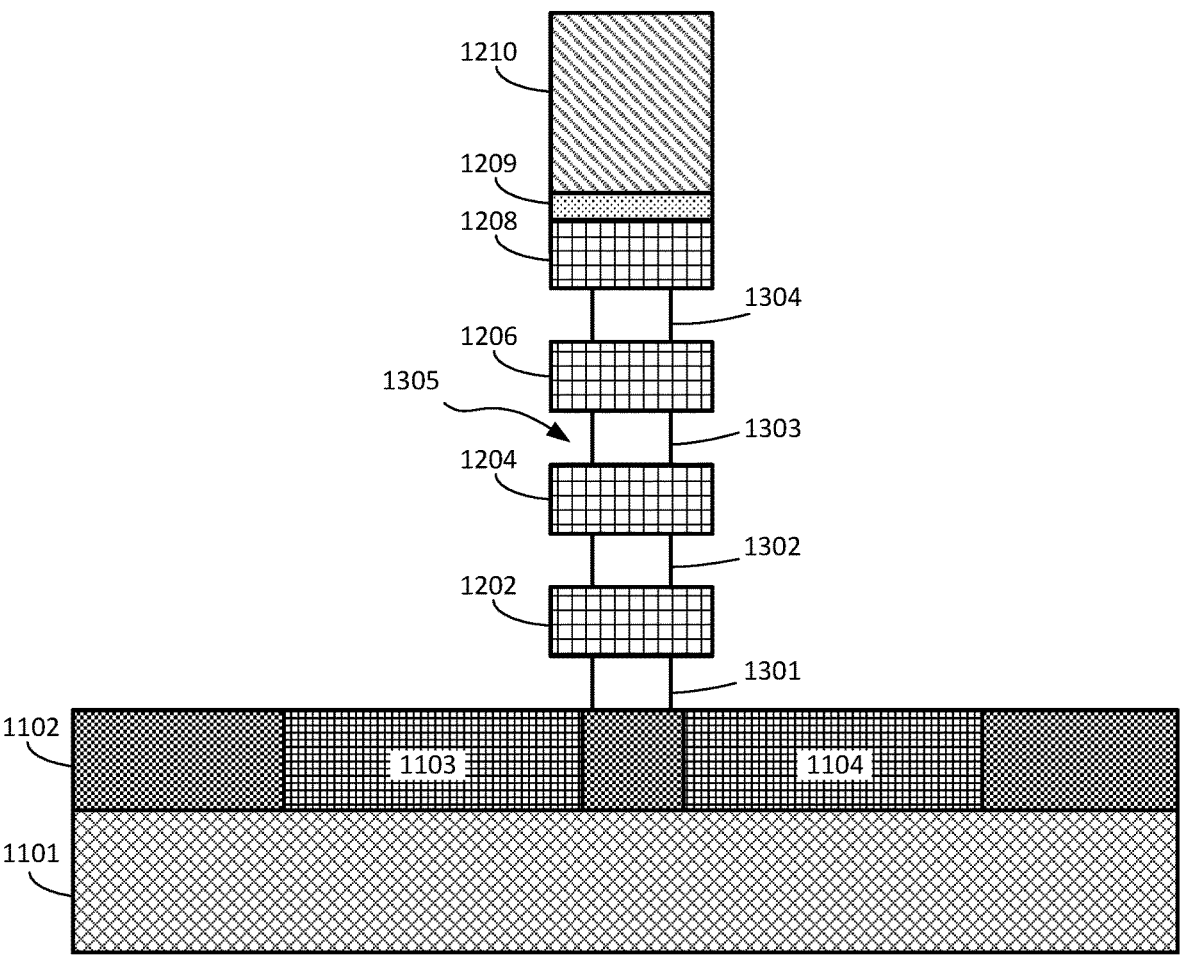

Referring to FIG. 13, according to some embodiments, the A material dielectric layers, including the patterned first dielectric A layer 1201, the patterned second dielectric A layer 1203, the patterned third dielectric A layer 1205, and the patterned fourth dielectric A layer 1207, are reduced in width, e.g., by an isotropic etch, forming a reduced first dielectric A layer 1301, a reduced second dielectric A layer 1302, a reduced third dielectric A layer 1303, and a reduced fourth dielectric A layer 1304. According to some embodiments, the reduction of the A material dielectric layers creates cavities, e.g., cavity 1305, above and/or below the B material dielectric layers. According to some embodiments, a width of the reduced first dielectric A layer 1301 is about the same (+/− about 1-2 nm) as that of the portion of the second patterned ILD layer 1102 between the fifth electrode 1103 and the sixth electrode 1104. According to some embodiments, a width of the reduced first dielectric A layer 1301 is larger than that of the portion of the second patterned ILD layer 1102 between the fifth electrode 1103 and the sixth electrode 1104 (e.g., where the reduced first dielectric A layer 1301 contacts a portion of the electrodes).

Figure 14:
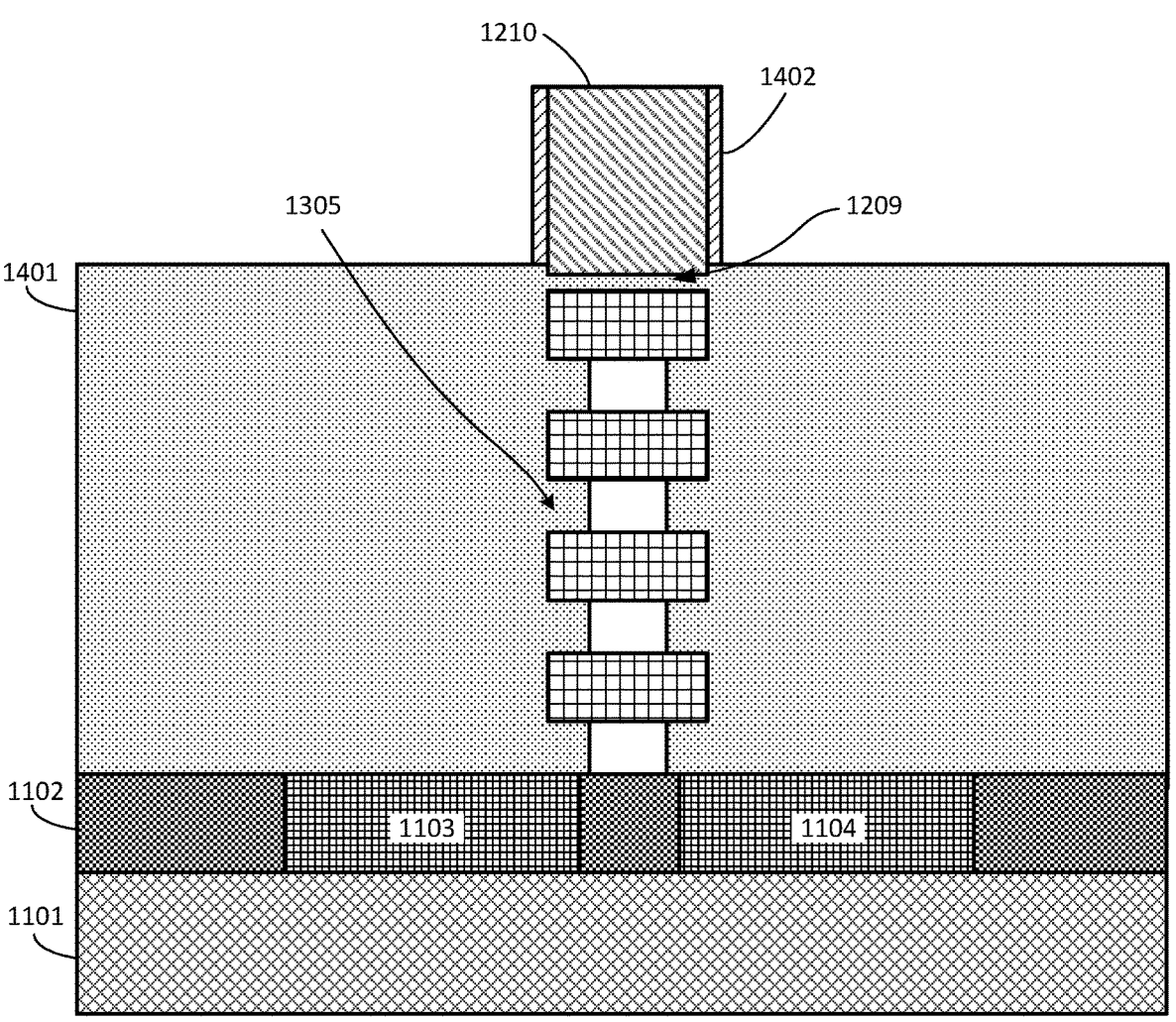

Referring to FIG. 14, according to some embodiments, a phase change material is deposited (e.g., overfilled), polished (e.g., by CMP), and recessed to form a fifth phase change material layer 1401. According to at least one embodiments, the fifth phase change material layer 1401 contacts the patterned fourth phase change material layer 1209 and fills the cavities above and/or below the B material dielectric layers, e.g., cavity 1305. According to one or more embodiments, a third spacer 1402 is formed on the fifth phase change material layer 1401 on a sidewall of the patterned third hardmask 1210. According to some embodiments, the third spacer 1402 has a thickness of about 5-35 nm on the sidewall of the patterned third hardmask 1210. According to one or more embodiments, the fifth phase change material layer 1401 has a height sufficient to contact the patterned fourth phase change material layer 1209, and preferably the height that extends above a height of an upper surface of the patterned fourth phase change material layer 1209.

Figure 15:
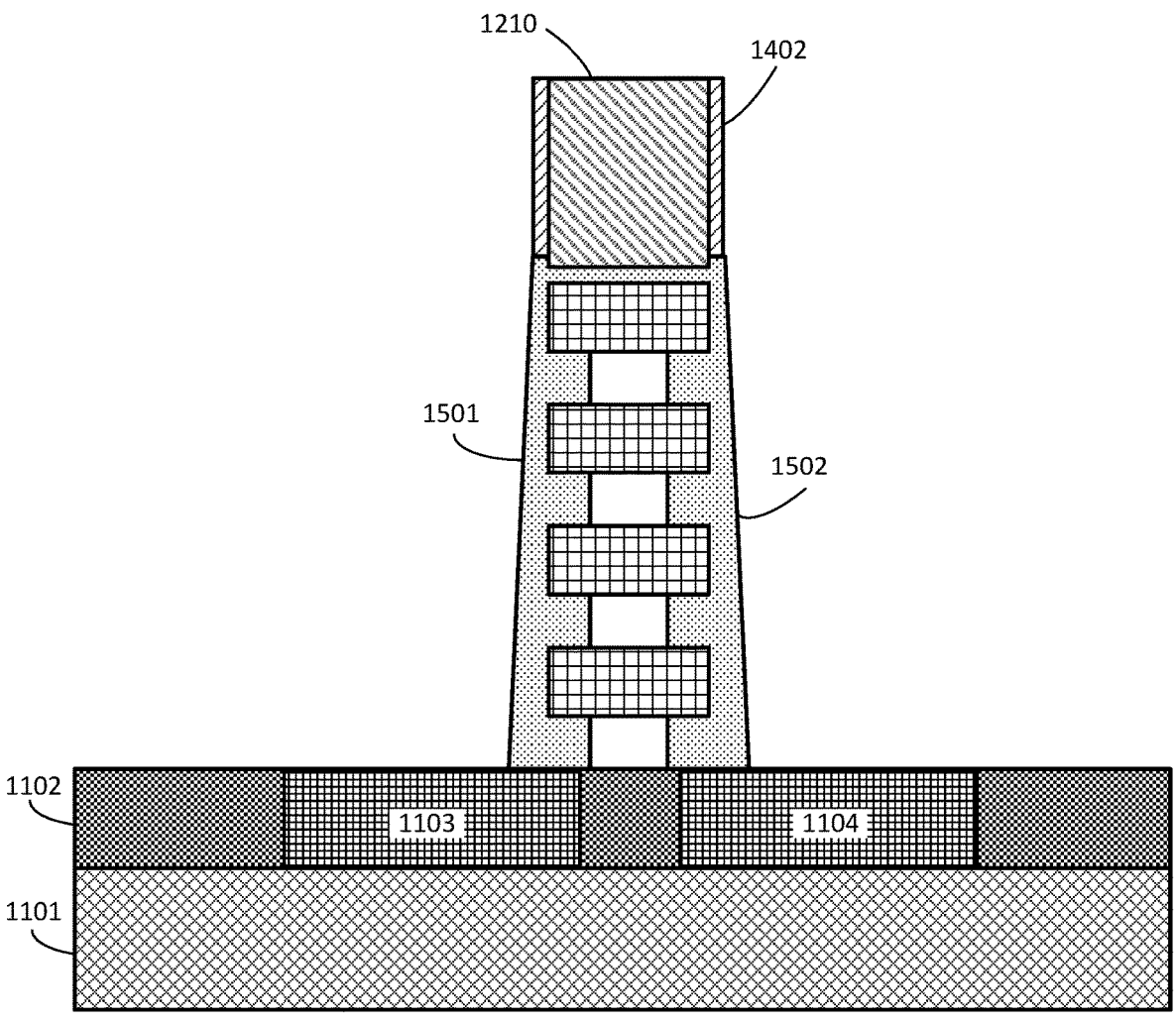

Referring to FIG. 15, according to some embodiments, the fifth phase change material layer 1401 can be patterned using the third spacer 1402 and the patterned third hardmask 1210 to form a second sloped phase change material 1501 and a second sloped phase change material 1502. According to some aspects, an angle of the slope can range from about 2-15 degrees. According to some embodiments, the fifth phase change material layer 1401 can be patterned by an etch. According to some embodiments, the second sloped phase change material 1501 and the second sloped phase change material 1502 contact the fifth electrode 1103 and the sixth electrode 1104, respectively.

Figure 16:
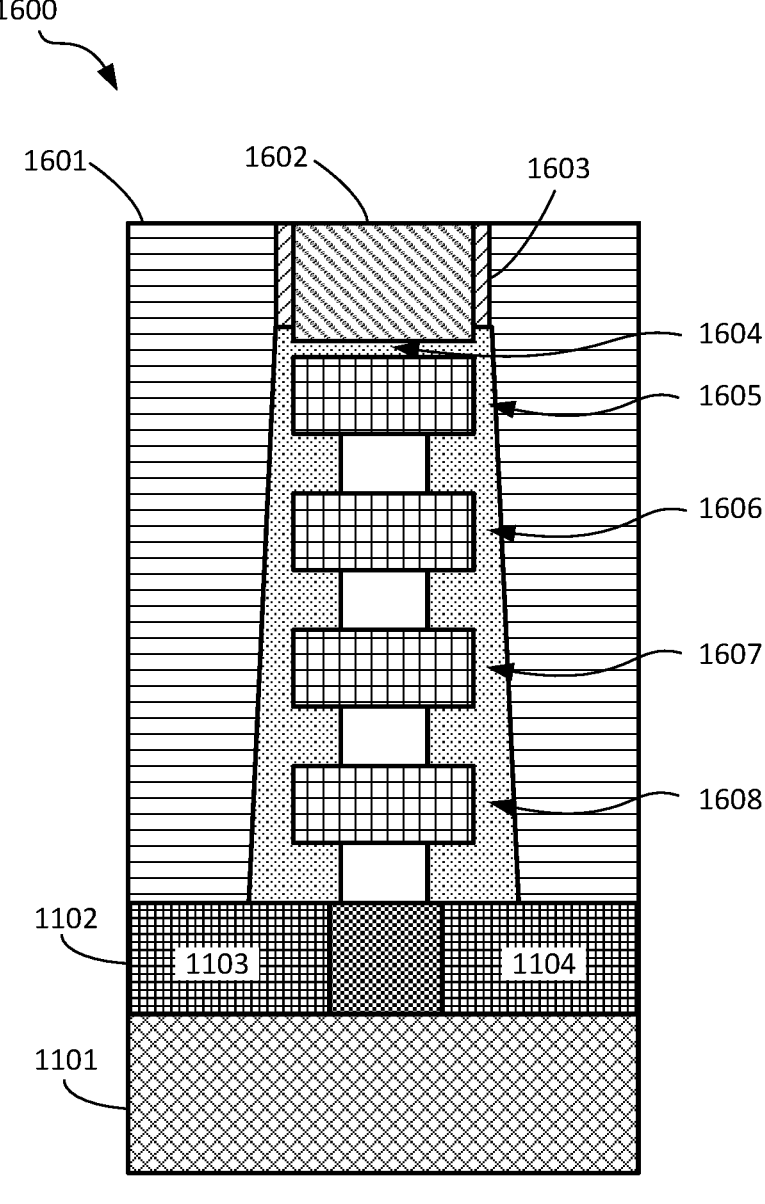

Referring to FIG. 16, according to some embodiments, an ILD can be deposited and polished (e.g., by CMP) to form a third ILD fill 1601. According to some embodiments the CMP may remove a top portion of the hardmask and spacer to form a thinned third hardmask 1602 and the thinned third spacer 1603.

According to some embodiments, stage 1 portion 1604, stage 2 portion 1605, stage 3 portion 1606, stage 4 portion 1607, and stage 5 portion 1608 have increasing functional dimensions (e.g., a height of the stage 1 portion 1604 between the patterned fourth dielectric B layer 1208 and the hardmask, is less than a width of the stage 2 portion 1605, which is turn is less than a width of the stage 3 portion 1606, etc.). As illustrated in FIG. 16, according to some embodiment, due to the increasing functional dimensions, with increasing programming voltage, crystalline phase neck portions, i.e., stage 1 portion 1604, stage 2 portion 1605, stage 3 portion 1606, stage 4 portion 1607, and stage 5 portion 1608, will sequentially become hot spots and change into amorphous phase material. That is, according to some embodiments, each of stage 1 portion 1604, stage 2 portion 1605, stage 3 portion 1606, stage 4 portion 1607, and stage 5 portion 1608 indicates an approximate position of a phase change in the second multiple-state phase change memory 1600.

Recapitulation:

According to embodiments of the present invention, a phase change bridge memory cell includes: a first interlevel dielectric layer (see first patterned ILD layer 202); a first electrode (203) and a second electrode (204) disposed in the first interlevel dielectric layer and separated by a portion of the first interlevel dielectric layer; an interlevel dielectric pillar (see patterned second ILD layer 301) on the portion of the first interlevel dielectric layer; a first phase change material (see 302) on the interlevel dielectric pillar; and a second phase change material (see patterned second phase change material 501) portion including two areas on opposite sides of the interlevel dielectric pillar and electrically connected by the first phase change material, wherein the second phase change material is connected to the first electrode and the second electrode.

According to at least one embodiment, the interlevel dielectric pillar includes: a plurality of first interlevel dielectric material layers (1301, 1302, 1303, 1304); and a plurality of second interlevel dielectric material layers (1202, 1204, 1206, 1208) interleaved with the first interlevel dielectric material layers, wherein a first width the plurality of first interlevel dielectric material layers is less than a second width of the plurality of second interlevel dielectric material layers, and wherein the second phase change material (1501, 1502) has a sloped sidewall opposite a sidewall of the interlevel dielectric pillar that defines a plurality of neck portions in the second phase change material, where a thickness of the second phase change material on sidewalls of the interlevel dielectric pillar is greater at the first electrode and the second electrode than at the first phase change material.

According to some embodiments, a phase change bridge memory cell includes: a substrate (see second substrate 701); a first phase change material (see patterned third phase change material 801) on the substrate; a second phase change material (see second patterned phase change material 901) portion including two areas electrically connected by the first phase change material; a pillar (see patterned fourth ILD layer 802, and patterned second hardmask 803) on the portion on the first phase change material and separating the two areas of the second phase change material; and a first electrode (see third electrode 1001) and a second electrode (see fourth electrode 1002) on the two areas of the second phase change material and separated by the pillar.

According to some embodiments, a method 100 of manufacturing a phase change memory device includes: providing a substrate at step 101; forming a first electrode and a second electrode at step 102; forming a first phase change material at step 103; forming an interlevel dielectric (ILD) pillar at step 104; forming a second phase change material and a third phase change material connected by the first phase change material at step 105, wherein the second phase change material is connected to the first electrode and the third phase change material is connected to the second electrode; and forming an ILD fill over the phase change memory device at step 106.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change bridge memory cell comprising:
   a first interlevel dielectric layer;
   a first electrode and a second electrode disposed in the first interlevel dielectric layer and separated by a portion of the first interlevel dielectric layer;
   an interlevel dielectric pillar on the portion of the first interlevel dielectric layer;
   a first phase change material on the interlevel dielectric pillar; and
   a second phase change material including two areas on opposite sides of the interlevel dielectric pillar and electrically connected by the first phase change material, wherein the second phase change material is connected to the first electrode and the second electrode.

2. The phase change bridge memory cell of claim 1, further comprising an interlevel dielectric fill disposed on sidewalls of the second phase change material.

3. The phase change bridge memory cell of claim 1, wherein a height of the first phase change material on the interlevel dielectric pillar is less than a width of the two areas of the second phase change material on sidewalls of the interlevel dielectric pillar.

4. The phase change bridge memory cell of claim 1, further comprising:
   a patterned hardmask on the first phase change material; and
   a first spacer around the patterned hardmask and on the second phase change material.

5. The phase change bridge memory cell of claim 1, wherein the second phase change material has a sloped sidewall opposite a sidewall of the interlevel dielectric pillar, where a thickness of the two areas of the second phase change material on sidewalls of the interlevel dielectric pillar is greater at the first electrode and the second electrode than at the first phase change material.

6. The phase change bridge memory cell of claim 1, wherein the interlevel dielectric pillar comprises:
   a plurality of first interlevel dielectric material layers; and
   a plurality of second interlevel dielectric material layers interleaved with the first interlevel dielectric material layers,
   wherein a first width of the plurality of first interlevel dielectric material layers is less than a second width of the plurality of second interlevel dielectric material layers, and
   wherein the second phase change material has a sloped sidewall opposite a sidewall of the interlevel dielectric pillar that defines a plurality of neck portions in the second phase change material, where a thickness of the second phase change material on sidewalls of the interlevel dielectric pillar is greater at the first electrode and the second electrode than at the first phase change material.

7. The phase change bridge memory cell of claim 6, wherein the plurality of neck portions have thicknesses, and a first thickness of a first neck portion adjacent the first electrode and the second electrode is greater than a second thickness of a second neck portion adjacent the first phase change material, and wherein no thickness of the plurality of neck portions is greater than a third thickness of the first phase change material on the interlevel dielectric pillar.

8. The phase change bridge memory cell of claim 6, wherein the first width of the plurality of first interlevel dielectric material layers is greater than or equal to a third width of the portion of the first interlevel dielectric layer between the first electrode and the second electrode.

9. A phase change bridge memory cell comprising:
   a substrate;
   a first phase change material on the substrate;

a second phase change material portion-including two areas electrically connected by the first phase change material;
   a pillar on the first phase change material and separating the two areas of the second phase change material; and
   a first electrode and a second electrode on the two areas of the second phase change material and separated by the pillar.

10. The phase change bridge memory cell of claim 9, further comprising an interlevel dielectric fill disposed on sidewalls of the second phase change material and the first electrode and the second electrode.

11. The phase change bridge memory cell of claim 9, wherein a height of the first phase change material under the pillar is less than a width of the two areas of the second phase change material on sidewalls of the pillar.

12. The phase change bridge memory cell of claim 9, wherein the pillar comprises an interlevel dielectric pillar on the first phase change material and a hardmask on the interlevel dielectric pillar.

* * * * *